(12) United States Patent
Ohnishi et al.

(10) Patent No.: US 8,476,805 B2
(45) Date of Patent: Jul. 2, 2013

(54) PIEZOELECTRIC/ELECTROSTRICTIVE ELEMENT HAVING A SPECIFIC COVERAGE AREA OF ELECTRODE ON SUBSTRATE, AND MANUFACTURING METHOD OF THE SAME

(75) Inventors: Takao Ohnishi, Fuso-Town (JP); Yuhji Umeda, Iwakura (JP); Naoki Goto, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 607 days.

(21) Appl. No.: 12/693,710

(22) Filed: Jan. 26, 2010

(65) Prior Publication Data

US 2010/0187953 A1   Jul. 29, 2010

(30) Foreign Application Priority Data

Jan. 29, 2009   (JP) .................................. 2009-018424

(51) Int. Cl.
*H01L 41/04* (2006.01)
*H01L 41/047* (2006.01)

(52) U.S. Cl.
USPC .......................................... 310/328; 310/365

(58) Field of Classification Search
USPC ................................................ 310/328, 365
See application file for complete search history.

(56) References Cited

U.S. PATENT DOCUMENTS

| | | | | |
|---|---|---|---|---|
| 5,504,388 | A * | 4/1996 | Kimura et al. | 310/363 |
| 5,774,961 | A * | 7/1998 | Takeuchi et al. | 29/25.35 |
| 6,570,300 | B1 | 5/2003 | Riedel et al. | |
| 6,897,601 | B2 * | 5/2005 | Birth et al. | 310/334 |
| 8,022,598 | B2 * | 9/2011 | Kuegerl et al. | 310/328 |
| 2004/0007947 | A1 | 1/2004 | Takahashi et al. | |
| 2005/0134144 | A1 | 6/2005 | Buhler et al. | |
| 2006/0119229 | A1 | 6/2006 | Koizumi et al. | |
| 2007/0001031 | A1 | 1/2007 | Sasaki | |
| 2008/0030102 | A1 | 2/2008 | Ohnishi et al. | |
| 2008/0098582 | A1 | 5/2008 | Ohnishi et al. | |
| 2008/0111453 | A1 | 5/2008 | Yoshioka et al. | |
| 2009/0072667 | A1 | 3/2009 | Ohnishi et al. | |
| 2009/0174419 | A1 | 7/2009 | Ohnishi et al. | |

FOREIGN PATENT DOCUMENTS

| | | |
|---|---|---|
| JP | 05206534 A * | 8/1993 |
| JP | 2001-250994 A1 | 9/2001 |
| JP | 2001-284677 A1 | 10/2001 |
| JP | 2005-050830 A1 | 2/2005 |
| JP | 2005-340387 A1 | 12/2005 |
| JP | 2006-165007 A1 | 6/2006 |
| WO | 2006/109501 A1 | 10/2006 |
| WO | 2007/123278 A1 | 11/2007 |
| WO | 2008/047460 | 4/2008 |
| WO | 2008/117476 | 10/2008 |

OTHER PUBLICATIONS

Japan Office Action dated Jan. 10, 2012 (with English translation).
European Office Action dated Feb. 10, 2012.

\* cited by examiner

*Primary Examiner* — J. San Martin
(74) *Attorney, Agent, or Firm* — Burr & Brown

(57) ABSTRACT

There is disclosed a piezoelectric/electrostrictive element which can be used as a sensor, even if a piezoelectric/electrostrictive layer cracks. Provided is a piezoelectric/electrostrictive element comprising a substrate, a lower electrode layer secured onto the substrate, and a piezoelectric/electrostrictive layer secured onto the lower electrode layer, and the coverage of the lower electrode layer with respect to the substrate is 98% or less.

6 Claims, 1 Drawing Sheet

PIEZOELECTRIC/ELECTROSTRICTIVE ELEMENT HAVING A SPECIFIC COVERAGE AREA OF ELECTRODE ON SUBSTRATE, AND MANUFACTURING METHOD OF THE SAME

BACKGROUND OF THE INVENTION

1. Field of the Invention

The present invention relates to a piezoelectric/electrostrictive element having an electrode layer provided on a substrate and a piezoelectric/electrostrictive layer provided on the electrode layer, and a manufacturing method of the element.

2. Description of the Related Art

In a piezoelectric/electrostrictive element, for example, an electrode layer containing a metal as a main component is secured onto the surface of a (ceramic) substrate containing zirconia as a main component, and a piezoelectric/electrostrictive layer is secured onto the electrode layer (see Patent Document 1).

Such a piezoelectric/electrostrictive element can be prepared, for example, by first forming, on the surface of the substrate, a coat layer as a first layer which can become the electrode layer, and forming, on this first layer, a second layer (which becomes the piezoelectric/electrostrictive layer) containing a piezoelectric/electrostrictive material, followed by heating and firing at a predetermined temperature and then cooling. The electrode layer itself may be formed as the first layer from the beginning, and in this case, the second layer is only fired in the step of the firing. It is to be noted that documents of the prior art are as follows:
[Patent Document 1] JP-A-2001-284677
[Patent Document 2] JP-A-2006-165007
[Patent Document 3] WO2006/109501A1

Moreover, in such a piezoelectric/electrostrictive element, for example, a through channel is provided on the side of the substrate opposite to the electrode layer and the piezoelectric/electrostrictive layer, and the element can function as a sensor of a fluid which passes through this through channel.

For example, the piezoelectric/electrostrictive element may be resonated, and by the scant change of a resonance frequency, the presence of the fluid can be detected. In this case, by use of the presence of a correlation between the amplitude of the piezoelectric/electrostrictive element and the viscous resistance of the fluid which comes in contact with the piezoelectric/electrostrictive element, properties such as the density, concentration and viscosity of the fluid can be measured.

Specifically, when this piezoelectric/electrostrictive element is vibrated in the presence of the fluid, the piezoelectric/electrostrictive element meets with a mechanical resistance owing to the viscosity of the fluid. Here, the mechanical vibration state of the piezoelectric/electrostrictive element can be replaced with an equivalent electric circuit. Therefore, the electric constant of the equivalent circuit of a piezoelectric/electrostrictive film of the piezoelectric/electrostrictive element changes based on the viscous resistance exerted on the piezoelectric/electrostrictive element. This change of the electric constant is detected to measure properties such as the viscosity, density and concentration of the fluid.

Examples of the fluid whose properties can be measured by the piezoelectric/electrostrictive element include both a liquid and a gas. Examples of the liquid as a measurement target include not only a liquid comprising a single-component liquid containing an only main medium selected from the group consisting of water, alcohol and oil but also a liquid (a slurry, a paste or the like) obtained by adding (dissolving, mixing, dispersing or suspending), to such a main medium, another soluble, sparingly soluble or insoluble medium.

Moreover, examples of the above electric constant include loss coefficient, phase, resistance, reactance, conductance, susceptance, inductance and capacitance. In particular, the loss coefficient or phase having one maximum or minimum change point in the vicinity of the resonance frequency of the equivalent circuit is preferably used. In consequence, not only the viscosity but also the density or concentration of the fluid can be measured. For example, the concentration of sulfuric acid in an aqueous sulfuric acid solution can be measured. It is to be noted that as an index for detecting the change of the vibration state, the change of the resonance frequency may be used instead of the above electric constant, if any special problem does not occur from the viewpoint of measurement accuracy or durability.

However, in this type of piezoelectric/electrostrictive element, if the characteristics (sensor sensitivity, etc.) of the piezoelectric/electrostrictive element are improved by further increasing a flexural displacement amount or an internal stress value, a problem of durability, for example, cracking in the piezoelectric/electrostrictive layer or the like occurs. In this case, the output or resonance frequency of the piezoelectric/electrostrictive element noticeably changes beyond a sensing range, and hence the element cannot be used as the sensor.

SUMMARY OF THE INVENTION

The present invention has been developed in view of the above problem, and an object thereof is to provide a piezoelectric/electrostrictive element which can be used as a sensor, even if a piezoelectric/electrostrictive layer cracks. As a result of repeated investigations, it has been found out that this object can be achieved by the following means.

That is, first, according to the present invention, there is provided a piezoelectric/electrostrictive element comprising a substrate, an electrode layer secured onto the substrate, and a piezoelectric/electrostrictive layer secured onto the electrode layer, wherein the coverage of the electrode layer with respect to the substrate is 98% or less.

In the piezoelectric/electrostrictive element according to the present invention, the coverage of the electrode layer is preferably 65 to 98%, more preferably 75 to 95%. If the coverage is less than 65%, the disconnection of electrodes is unfavorably feared.

In the piezoelectric/electrostrictive element according to the present invention, the thickness of the electrode layer is preferably 5 μm or less.

In the piezoelectric/electrostrictive element according to the present invention, the thickness of the electrode layer is more preferably 0.1 to 5 μm, especially preferably 0.1 to 3 μm. If the thickness exceeds 5 μm, the displacement characteristics of the piezoelectric/electrostrictive layer are impaired owing to the thickness of the electrode layer. If the thickness is less than 0.1 μm, the disconnection is unfavorably feared.

Next, according to the present invention, there is provided a manufacturing method of a piezoelectric/electrostrictive element, comprising a first layer forming step of forming a first layer containing a metal on a substrate so that a coverage is 98% or less; a second layer forming step of forming a second layer containing a piezoelectric/electrostrictive material on the first layer formed by the first layer forming step; a firing step of heating and firing the substrate on which the first and second layers are formed; and a cooling step of cooling the substrate on which the first and second layers are formed, after the firing step.

In the manufacturing method of the piezoelectric/electrostrictive element according to the present invention, the coverage of the first layer is preferably 65 to 98%, more preferably 75 to 95%.

In the manufacturing method of the piezoelectric/electrostrictive element according to the present invention, when the first layer forming step is a step of directly forming an electrode layer of a metal on the substrate by evaporation, plating or the like, the first layer is the electrode layer itself. Alternatively, when the first layer forming step requires, for example, a metal paste coating step, that is, a predetermined post-step (a heat treatment or the like) for obtaining the final electrode layer, the first layer is a layer before subjected to the predetermined post-step (the metal paste coating layer or the like). In this case, the electrode layer can be, for example, fired together with the second layer in the firing step. Alternatively, the electrode layer may be fired in an electrode layer firing step performed prior to the second layer forming step.

In the manufacturing method of the piezoelectric/electrostrictive element according to the present invention, the thickness of the first layer is preferably 5 μm or less.

In the manufacturing method of the piezoelectric/electrostrictive element according to the present invention, the thickness of the first layer is more preferably 0.1 to 5 μm, especially preferably 0.1 to 3 μm.

In the piezoelectric/electrostrictive element according to the present invention, the coverage of the electrode layer with respect to the substrate is 98% or less, and hence even in a case where the piezoelectric/electrostrictive layer cracks, an output or resonance frequency does not noticeably change as compared with a case where the piezoelectric/electrostrictive layer does not crack. If the coverage is 98% or more, the output or resonance frequency in the case of the occurrence of the cracking lowers.

This is supposedly because the coverage of the electrode layer with respect to the substrate is 98% or less, the piezoelectric/electrostrictive layer does not come in contact closely with the substrate, and hence the cracking of the piezoelectric/electrostrictive layer stops in a certain stage and does not develop. That is, in a conventional piezoelectric/electrostrictive element, the piezoelectric/electrostrictive layer comes in contact with the substrate via the electrode layer secured to the piezoelectric/electrostrictive layer and the substrate. Therefore, if the piezoelectric/electrostrictive layer once cracks, the cracking continuously develops, thereby noticeably changing the output or resonance frequency. However, according to the piezoelectric/electrostrictive element of the present invention, it is presumed that any cracking does not develop, and hence the output or resonance frequency does not generally change.

As the configuration in which the electrode layer covers the substrate, a configuration is preferable in which a covering portion and a non-covering portion are uniformly present, and a configuration is not preferable in which the non-covering portion has a continuously large range. In other words, the preferable configuration is a configuration in which the electrode layer and voids are uniformly present between the piezoelectric/electrostrictive layer and the substrate.

It is to be noted that in the present description, when the substrate is seen from a piezoelectric/electrostrictive layer side, the coverage (of the electrode layer with respect to the substrate) is a value (indicated in %) obtained by dividing the area of a portion covered with the electrode layer (the area of the electrode layer) by the contour (whole) area of the electrode layer. A portion covered with the electrode layer (where the electrode layer is present) is referred to as the covering portion, and a portion which is disposed inside the electrode layer and which is not covered with the electrode layer (where any electrode layer is not present) is referred to as the non-covering portion. The coverage=(the covering portion/the whole area)×100. The coverage can easily be calculated by image processing.

DETAILED DESCRIPTION OF THE INVENTION

Figure 1:
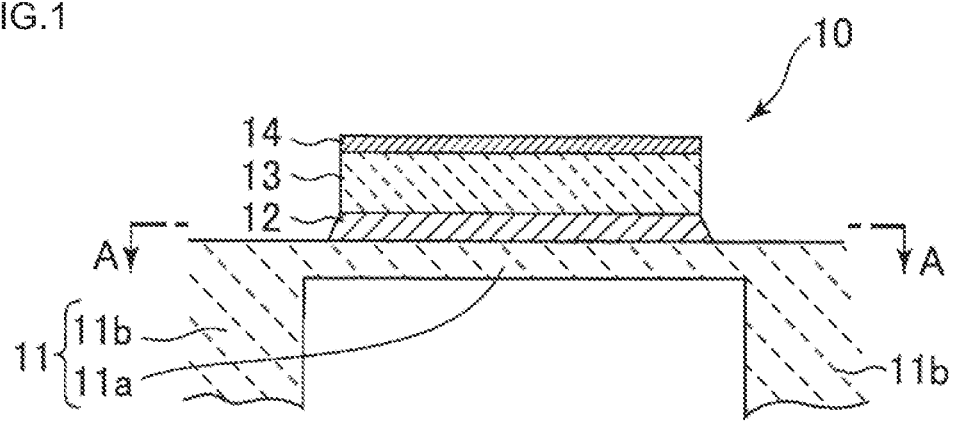
FIG. 1 is a diagram showing one embodiment of a piezoelectric/electrostrictive element according to the present invention, and a sectional view of a substrate, a lower electrode layer, a piezoelectric/electrostrictive layer and an upper electrode layer in a direction vertical to a laminating direction thereof.

Hereinafter, an embodiment of the present invention will be described appropriately with reference to the drawings, but the present invention should not be limited to the embodiment when interpreted, and various alterations, modifications or improvements can be added based on the knowledge of a person with ordinary skill without departing from the scope of the present invention. For example, the drawings show the preferable embodiment of the present invention, but the present invention is not restricted by configuration or information shown in the drawings. When the present invention is carried out or verified, means similar or equivalent to means described in the present specification can be applied, but the preferable means are as follows.

Figure 2:
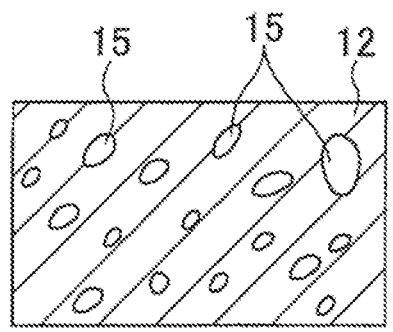
FIG. 2 is a sectional view cut along the AA line of FIG. 1 and showing the lower electrode layer.

A piezoelectric/electrostrictive element 10 shown in FIGS. 1 and 2 comprises a substrate 11 constituted of a vibration plate 11a and a support portion 11b, a lower electrode layer 12 formed on the substrate 11 (the vibration plate 11a), a piezoelectric/electrostrictive layer 13 formed on the lower electrode layer 12, and an upper electrode layer 14 formed on the piezoelectric/electrostrictive layer 13.

In the piezoelectric/electrostrictive element 10, a polarization voltage is applied across the lower electrode layer 12 and the upper electrode layer 14, whereby the polarization treatment of the piezoelectric/electrostrictive layer 13 is performed so that a polarizing direction is aligned in a vertical direction in FIG. 1. After this polarization treatment, a predetermined driving voltage is applied across the lower electrode layer 12 and the upper electrode layer 14, whereby the piezoelectric/electrostrictive layer 13 expands or contracts and is deformed in the vertical direction in FIG. 1. By this expanding/contracting deformation, and flexural deformation due to expanding/contracting deformation in a lateral direction, the vibration plate 11a extended between the support portions 11b and 11b is deformed so as to bend.

The substrate 11 is made of a ceramic thin plate. As the material of the substrate 11, for example, zirconium oxide, aluminum oxide, magnesium oxide, aluminum nitride or silicon nitride is preferably usable. Moreover, as to zirconium oxide, a material containing completely or partially stabilized zirconium oxide as a main component is most preferably usable because even if the material is thinned, the material has a high mechanical strength, toughness, small reactivity with respect to the material of the lower electrode layer 12 and the piezoelectric/electrostrictive layer 13 and the like.

The lower electrode layer 12 is secured onto the surface of the substrate 11 so that voids 15 are non-densely and non-uniformly present and so that the coverage is, for example, 85%. Here, the securing means that the lower electrode layer and the substrate excluding the voids 15 are directly and closely joined without using any adhesive.

The lower electrode layer 12 is a layer containing a metal as a main component, and as this main component metal, platinum, gold, silver, iridium, palladium, rhodium, molybdenum, tungsten or an alloy of them is preferably usable. Moreover, to the lower electrode layer 12, an additive (e.g., low melting glass or the like) for enhancing close contact properties with respect to the substrate 11 or the like may appropriately be added in accordance with a combination of the material of the substrate 11 or the piezoelectric/electrostrictive layer 13 and the type of the metal. The thickness of the lower electrode layer 12 is (for example) 3 μm.

The piezoelectric/electrostrictive layer 13 is secured onto the lower electrode layer 12. The piezoelectric/electrostrictive layer 13 is made of a piezoelectric/electrostrictive material (a piezoelectric ceramic material). As this piezoelectric/electrostrictive material, a material containing a perovskite type ferroelectric material, a tungsten-bronze type ferroelectric material, a bismuth layer-like ferroelectric material or the like as a main component is preferably usable. The thickness of the piezoelectric/electrostrictive layer 13 is preferably 3 to 50 μm, more preferably 3 to 40 μm.

Specific examples of the above ferroelectric material include lead-based materials such as lead titanate, lead zirconate, lead zirconate titanate (PZT), lead magnesium niobate (PMN), lead nickel niobate (PNN), lead manganese niobate, lead antimony stannate and lead zinc niobate. Moreover, examples of a non-lead-based material include barium titanate, bismuth sodium titanate, strontium sodium niobate, barium sodium niobate, potassium niobate, bismuth nickel titanate, $Ba_2NaNb_5O_{15}$, $Bi_4Ti_3O_{12}$ (BIT), $BaNd_2Ti_4O_{12}$ (BNT), and $(Bi_{0.5}Na_{0.5})TiO_3$. Alternatively, a composite material such as a mixture or a solid solution of them (e.g., a PMN-PZ-PT three component solid solution, a $(Bi_{0.5}Na_{0.5})TiO_3$—$BaTiO_3$(BNT-BT)-based solid solution, a $(Bi_{0.5}Na_{0.5})TiO_3$—$BaTiO_3$—$SrTiO_3$ (BNT-BT-ST)-based solid solution, (1-x) $(Bi_{0.5}Na_{0.5})TiO_3$-x$KNbO_3$ [x: $0 \leq x \leq 0.06$ in terms of molar fraction] or the like) is preferably usable. It is to be noted that an oxide or another compound of lanthanum, barium, niobium, zinc, cerium, cadmium, chromium, cobalt, strontium, antimony, iron, yttrium, tantalum, tungsten, nickel, manganese or the like may appropriately be added to the piezoelectric/electrostrictive material.

Examples of the piezoelectric/electrostrictive material of the piezoelectric/electrostrictive layer 13 include an oxide (e.g., BaO, $Na_2O$, $TiO_2$, $K_2O$, $Nb_2O_5$ or the like) of an element such as Ba, Bi, Na, Ti, K or Nb, a compound (e.g., hydroxide, carbonate, oxalate, nitrate or the like) of the element which changes to the oxide when fired, a compound (e.g., $MgNb_2O$) containing a plurality of elements, a unitary metal of each element and an alloy of the element. The materials may be used alone or as a combination of two or more of them. As a forming method of the piezoelectric/electrostrictive layer 13, for example, a usual manufacturing process such as a screen printing process, a dipping process, a coating process or a green sheet process may be used.

The upper electrode layer 14 is secured onto the piezoelectric/electrostrictive layer 13. The material and thickness of the upper electrode layer 14 may substantially be the same as those of the lower electrode layer 12. In addition, the upper electrode layer 14 may be similar to the lower electrode layer, and may not have any void.

Next, a manufacturing method of the piezoelectric/electrostrictive element according to the present invention will be described with respect to an example of the manufacturing of the piezoelectric/electrostrictive element 10.

First, the substrate 11 is prepared. Then, as the lower electrode layer 12 on the substrate 11, a film is formed by using an electrode paste containing the appropriate amount of a resin by the screen printing process, and fired so that the coverage is, for example, 60% (a lower electrode layer forming step). As a forming method of the lower electrode layer 12, besides the screen printing process, for example, ion beam, sputtering, vacuum evaporation, PVD, ion plating, CVD, plating, spray coating, dipping or the like may be used. Among them, the sputtering or the screen printing is preferably used from the viewpoint of bonding properties between the substrate 11 and the piezoelectric/electrostrictive layer 13.

It is to be noted that the formed lower electrode layer 12 can be heat-treated at a temperature of about 500 to 1400° C., and integrally secured onto the substrate 11. This heat treatment may be performed before forming the unfired piezoelectric/electrostrictive layer, or simultaneously with a heat treatment to fire the piezoelectric/electrostrictive layer. In consideration of piezoelectric/electrostrictive characteristics, a low-melting metal electrode made of Ag, Au or the like is preferably used as the lower electrode layer 12, when the piezoelectric/electrostrictive material used for the piezoelectric/electrostrictive layer 13 is fired at a low temperature of 1000° C. or less.

Next, on the lower electrode layer 12, the unfired piezoelectric/electrostrictive layer containing the piezoelectric/electrostrictive material is formed (an unfired piezoelectric/electrostrictive layer forming step). As a forming method of this piezoelectric/electrostrictive layer before fired, for example, a screen printing process, a dipping process, a coating process, an electrophoretic process or the like is used. Moreover, a usual process which does not necessarily require the firing, for example, an aerosol deposition process, an ion beam process, a sputtering process, a vacuum evaporation process, an ion plating process, a chemical vapor deposition (CVD) process, plating, a green sheet process or the like may be used for forming the piezoelectric/electrostrictive layer.

Subsequently, this formed unfired piezoelectric/electrostrictive layer is fired at a temperature of about 1100 to 1300° C. (examples of "the firing" mentioned herein include not only the firing usually performed in the case of the use of a wet process such as the green sheet process but also the heat treatment performed for the densification of a tissue in the case of the use of a dry process such as the aerosol deposition process), whereby the piezoelectric/electrostrictive layer 13 is formed (a firing step).

Next, the upper electrode layer 14 is formed on the piezoelectric/electrostrictive layer 13 (an upper electrode layer forming step). A forming method of this upper electrode layer 14 conforms to the forming method of the lower electrode layer 12.

It is to be noted that the formed upper electrode layer 14 can be heat-treated at a temperature of about 500 to 1300° C., and integrally secured onto the piezoelectric/electrostrictive layer 13. This heat treatment may be performed after firing the piezoelectric/electrostrictive layer, or simultaneously with the heat treatment to fire the piezoelectric/electrostrictive layer. In consideration of the piezoelectric/electrostrictive characteristics, a low-melting metal electrode made of Ag, Au or the like is preferably used as the upper electrode layer 14, when the piezoelectric/electrostrictive material used for the piezoelectric/electrostrictive layer 13 is fired at a low temperature of 1000° C. or less.

Finally, cooling is performed (a cooling step). Then, a polarization treatment is performed before the use.

EXAMPLES

Hereinafter, an example for confirming the effect of the present invention will be described. In this example, the change ratio of the resonance frequency of a piezoelectric/electrostrictive element 10 is evaluated, when the coverage of an electrode layer of the piezoelectric/electrostrictive element 10 shown in FIGS. 1 and 2 is changed.

Example 1

A product of a piezoelectric/electrostrictive element 10 in which the coverage of a lower electrode layer 12 was 80% was prepared, and a primary resonance frequency was detected by using a network analyzer. Afterward, it was confirmed that the applying of a direct-current voltage of 200 [V] for several minutes caused cracking in a piezoelectric/electrostrictive layer 13. Then, the change ratio of the resonance frequency was obtained based on the resonance frequencies before and after the occurrence of the cracking. Results are shown in Table 1.

TABLE 1

| | Coverage of electrode layer | Change of resonance frequency |
|---|---|---|
| Example 1 | 80% | −2% |
| Comparative Example 1 | 99% | −15% |

Comparative Example 1

In a piezoelectric/electrostrictive element 10, resonance frequencies before and after the occurrence of cracking in a piezoelectric/electrostrictive layer 13 were obtained in the same manner as in Example 1 except that the coverage of a lower electrode layer 12 was set to 99%, and the change ratio of the resonance frequency was obtained based on the resonance frequencies. Results are shown in Table 1.

(Consideration) According to the results shown in Table 1, it is presumed that in a case where the coverage of the lower electrode layer 12 is set to 98% or less and the piezoelectric/electrostrictive layer 13 cracks, the resonance frequency does not noticeably change as compared with a case where the piezoelectric/electrostrictive layer 13 does not crack.

It is to be noted that the piezoelectric/electrostrictive element 10 was prepared on the following conditions commonly for Example 1 and Comparative Example 1.

As a material of a vibration plate 11a and a support portion 11b (the substrate 11), a substrate of $ZrO_2$ stabilized by $Y_2O_3$ was used, and the thickness of the vibration plate was set to 11 μm. The thickness of each of the lower electrode layer 12 and an upper electrode layer 14 was set to 3 μm, and platinum was used as the material thereof. As a material of the piezoelectric/electrostrictive layer 13 (the piezoelectric/electrostrictive material), a solid solution (BNT-KN) of bismuth sodium titanate and potassium niobate was used, and the thickness of the layer was set to 20 μm.

In a lower electrode layer forming step, a coat layer of paste-like platinum was formed on the substrate 11 (the vibration plate 11a) by a screen printing process, and this coat layer was dried and heat-treated at a temperature of about 1400° C., thereby forming the lower electrode layer 12.

In an unfired piezoelectric/electrostrictive layer forming step, the lower electrode layer 12 was coated with a slurry obtained by dispersing BNT-KN powder in a binder by the screen printing process to form the coat layer of the piezoelectric/electrostrictive material on the lower electrode layer. In a firing step, the binder was removed at a temperature of about 500° C., followed by heating at 1100° C. for three hours, whereby the piezoelectric/electrostrictive layer 13 was formed.

In an upper electrode layer forming step, in the same manner as in the lower electrode layer forming step, a coat layer of paste-like platinum was formed on the piezoelectric/electrostrictive layer 13 by the screen printing process, and this coat layer was dried and heat-treated at a temperature of about 800° C., thereby forming the upper electrode layer 14.

As a polarization voltage, a direct current 150 V was applied.

A piezoelectric/electrostrictive element according to the present invention is preferably utilized as a piezoelectric/electrostrictive element provided in various piezoelectric actuators (piezoelectric devices) for a measuring instrument, an optical modulator, an optical switch, a micro valve, a conveyance device, an image display device (a display, a projector or the like), an image drawing device, a micro pump, a liquid drop discharge device, a micro mixing device, a micro stirring device, a micro reaction device and the like, or various piezoelectric sensors (piezoelectric devices) used for detecting fluid characteristics, acoustic pressure, micro weight, acceleration degree and the like.

DESCRIPTION OF REFERENCE NUMERALS

10: piezoelectric/electrostrictive element, 11: substrate, 11a: vibration plate, 11b: support portion, 12: lower electrode layer, 13: piezoelectric/electrostrictive layer, and 14: upper electrode layer.

What is claimed is:

1. A piezoelectric/electrostrictive element comprising a substrate, an electrode layer secured onto the substrate, and a piezoelectric/electrostrictive layer secured onto the electrode layer,
    wherein the electrode layer and voids are uniformly present between the piezoelectric/electrostrictive layer and the substrate, and
    wherein the coverage of the electrode layer with respect to the substrate is 98% or less.

2. The piezoelectric/electrostrictive element according to claim 1, wherein the thickness of the electrode layer is 5 μm or less.

3. The piezoelectric/electrostrictive element according to claim 1, wherein the coverage of the electrode layer with respect to the substrate is 80% or less.

4. The piezoelectric/electrostrictive element according to claim 1, wherein the coverage of the electrode layer with respect to the substrate is 60% or less.

5. A manufacturing method of a piezoelectric/electrostrictive element, comprising:
    a first layer forming step of forming a first layer containing a metal on a substrate;
    a second layer forming step of forming a second layer containing a piezoelectric/electrostrictive material on the first layer formed by the first layer forming step;
    a firing step of heating and firing the substrate on which the first and second layers are formed;

a cooling step of cooling the substrate on which the first and second layers are formed, after the firing step; and wherein the first layer and voids are uniformly present between the second layer containing the piezoelectric/electrostrictive material and the substrate, and wherein the coverage of the first layer with respect to the substrate is 98% or less.

6. The manufacturing method of the piezoelectric/electrostrictive element according to claim 5, wherein the thickness of the first layer is 5 μm or less.

* * * * *